United States Patent
Chung

(10) Patent No.: US 7,724,601 B2
(45) Date of Patent: May 25, 2010

(54) ELECTRICAL FUSES WITH REDUNDANCY

(75) Inventor: Shine Chien Chung, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/145,879

(22) Filed: Jun. 25, 2008

(65) Prior Publication Data

US 2008/0252361 A1     Oct. 16, 2008

Related U.S. Application Data

(62) Division of application No. 11/074,920, filed on Mar. 7, 2005, now Pat. No. 7,405,989.

(51) Int. Cl.
*G11C 17/18* (2006.01)

(52) U.S. Cl. .............. 365/225.7; 365/96; 365/200; 365/230.06; 365/230.08

(58) Field of Classification Search .............. None
See application file for complete search history.

(56) References Cited

U.S. PATENT DOCUMENTS

| | | | |
|---|---|---|---|
| 5,200,922 A | 4/1993 | Rao | |
| 5,392,246 A | 2/1995 | Akiyama et al. | |
| 5,422,850 A | 6/1995 | Sukegawa et al. | |
| 5,425,251 A | 6/1995 | Schmid et al. | |
| 5,452,251 A | 9/1995 | Akaogi et al. | |
| 5,469,388 A | 11/1995 | Park | |
| 5,487,039 A | 1/1996 | Sukegawa | |
| 5,548,555 A | 8/1996 | Lee et al. | |
| 5,659,551 A | 8/1997 | Huott et al. | |
| 5,708,291 A * | 1/1998 | Bohr et al. | 257/529 |
| 5,731,733 A * | 3/1998 | Denham | 327/525 |
| 5,933,382 A | 8/1999 | Yi et al. | |
| 5,959,906 A * | 9/1999 | Song et al. | 365/200 |
| 6,023,433 A * | 2/2000 | Koshikawa | 365/200 |
| 6,061,291 A | 5/2000 | Zheng | |
| 6,081,910 A | 6/2000 | Mifsud et al. | |
| 6,084,807 A | 7/2000 | Choi | |
| 6,166,981 A * | 12/2000 | Kirihata et al. | 365/225.7 |
| 6,199,177 B1 | 3/2001 | Blodgett | |
| 6,233,183 B1 | 5/2001 | Kim et al. | |
| 6,258,700 B1 * | 7/2001 | Bohr et al. | 438/467 |
| 6,411,556 B1 | 6/2002 | Amano | |
| 6,442,742 B1 * | 8/2002 | Sugibayashi | 716/8 |
| 6,536,002 B1 | 3/2003 | Kim | |
| 6,542,418 B2 | 4/2003 | Braceras et al. | |
| 6,611,466 B2 | 8/2003 | Lee et al. | |
| 6,920,073 B2 | 7/2005 | Lee | |
| 7,003,622 B2 * | 2/2006 | Shinohara et al. | 711/104 |
| 7,120,068 B2 | 10/2006 | Akiyama et al. | |
| 7,123,512 B2 | 10/2006 | Lakhani et al. | |

(Continued)

*Primary Examiner*—Viet Q Nguyen
(74) *Attorney, Agent, or Firm*—Duane Morris LLP

(57) ABSTRACT

The present disclosure provides an electrical fuse cell with redundancy features and the method for operating the same. The fuse cell includes a first set of electrical fuses having at least one electrical fuse contained therein, and a second set of electrical fuses having at least one electrical fuse for providing redundancy to at least one fuse of the first set, wherein if one of the first set of electrical fuses is defective, at least one of the second set of the electrical fuses can be programmed to provide a redundancy function of the defective fuse.

10 Claims, 4 Drawing Sheets

U.S. PATENT DOCUMENTS

| | | | |
|---|---|---|---|
| 7,254,069 B2 * | 8/2007 | Haraguchi et al. | 365/200 |
| 7,382,680 B2 * | 6/2008 | Nakano et al. | 365/233.1 |
| 7,388,782 B2 * | 6/2008 | Tokiwa | 365/185.09 |
| 7,405,989 B2 * | 7/2008 | Chung | 365/225.7 |
| 2008/0151593 A1 * | 6/2008 | Chen et al. | 365/96 |

* cited by examiner

ELECTRICAL FUSES WITH REDUNDANCY

CROSS-REFERENCE TO RELATED APPLICATION

This application is a divisional of application Ser. No. 11/074,920 filed Mar. 7, 2005, now U.S. Pat. No. 7,405,989, the entirety of which is hereby incorporated by reference herein.

BACKGROUND

The present invention relates generally to integrated circuit designs, and more particularly, to methods for implementing redundancy for electrical fuses.

Electrical fuses are designed to blow when a current through the fuses exceeds a threshold. Since the state of a blown fuse is practically irreversible, it may provide the function of nonvolatile data storages. Proper implementation of electrical fuses can provide more design flexibility, such as positioning the fuse within the chip, since wirings are allowed on metal layers above and below the fuses. The positioning advantage allows electrical fuses to be a desirable component in high-density memory devices.

However, some electrical fuses can be defective. Because of these defects, the electrical fuses are often programmed incorrectly. When these fuses are programmed incorrectly in digital circuits, faulty bits will exist. In a conventional fuse array, these faulty bits are often ignored since the capacity of a conventional fuse array is very limited, often in the range of tens to thousands of bits. This low capacity can provide a high yield without the need to repair any of the faulty bits.

However, as integrated circuit (IC) technologies continue to shrink in physical size, electrical fuses can be fabricated in very small size such that the dimension is small and the capacity of electrical fuses can be high. As capacity increases in newer process technology such as 0.13 um and beyond, the density of defects will increase and may result in a lower yield.

Therefore, desirable in the art of fuse designs are additional methods that, by introducing redundant electrical fuses, the yield of a semiconductor manufacturing process may be improved.

SUMMARY

In view of the foregoing, this invention provides methods and circuits for implementing redundancy for electrical fuses, thereby allowing easy repairs for defective electrical fuses by replacing the defective electrical fuses with additional electrical fuses.

In one embodiment, the fuse cell includes a first set of electrical fuses having at least one electrical fuse contained therein, and a second set of electrical fuses having at least one electrical fuse for providing redundancy to at least one fuse of the first set, wherein if one of the first set of electrical fuses is defective, at least one of the second set of the electrical fuses can be programmed to provide a redundancy function of the defective fuse.

The construction and method of operation of the invention, however, together with additional objects and advantages thereof will be best understood from the following description of specific embodiments when read in connection with the accompanying drawings.

DESCRIPTION

The present invention provides methods and circuits for implementing redundancy for electrical fuses.

Figure 1:
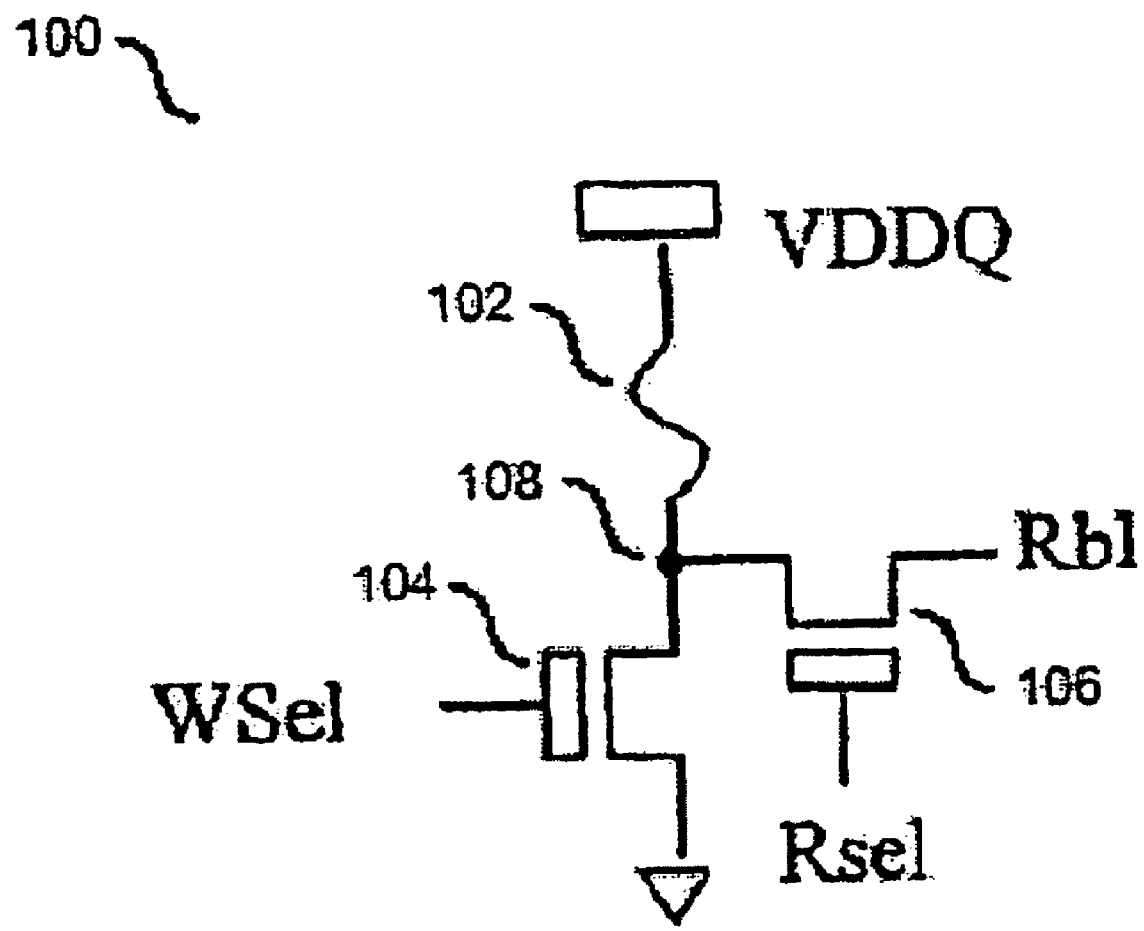
FIG. 1 presents a conventional fuse cell containing an electrical fuse connected to a programming device and an output select device.

FIG. 1 presents a conventional fuse cell 100 containing an electrical fuse 102 connected to a programming device 104 and an output select device 106. Both the programming device 104 and the output select device 106 are shown to be thick-oxide NMOS devices, although it is understood by those skilled in the art that these devices may be constructed in other known manners.

The electrical fuse 102 can be programmed to break by having high signal at a select line "WSel" to turn on the programming device 104. With the programming device 104 turned on, the high programming voltage from a voltage source VDDQ can reach, and then break, the electrical fuse 102. The electrical fuse 102 can also be read by turning off the programming device 104 with a low signal at the select line "WSel" and having a high signal at a select line "RSel" to turn on the output select device 106. A signal at a node 108 indicating the resistance of the electrical fuse 102 will be outputted to a read bit line Rbl.

Figure 2:
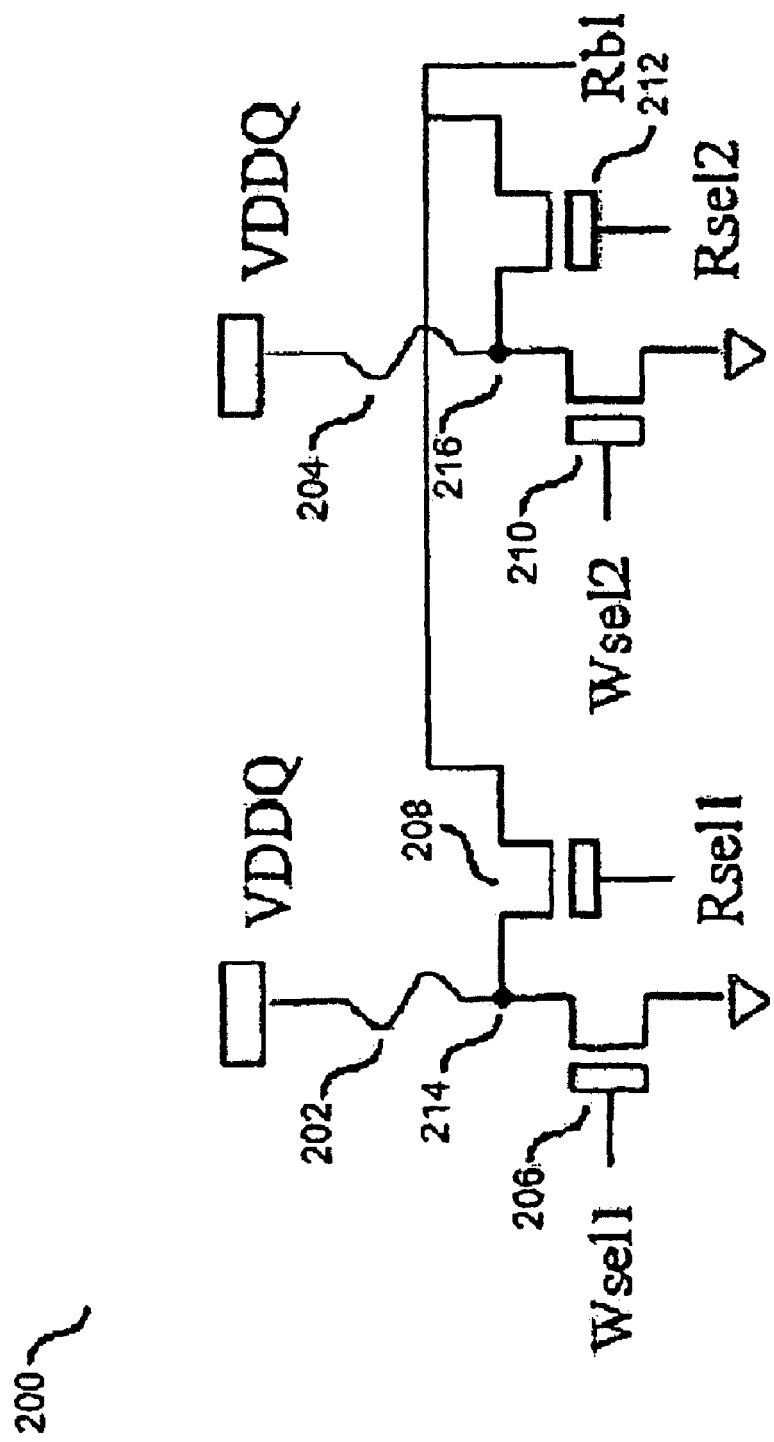
FIG. 2 presents a fuse cell with full redundancy in accordance with one embodiment of the present invention.

FIG. 2 presents a fuse cell 200 with 100 percent redundancy in accordance with the first embodiment of the present invention. The fuse cell 200 comprises electrical fuses 202 and 204. The electrical fuse 204 can be seen as a redundant electrical fuse, while the electrical fuse 202 can be seen as an original electrical fuse. The electrical fuses 202 and 204 are placed in parallel such that the redundant electrical fuse can be used as a replacement fuse if the original electrical fuse becomes defective. The electrical fuse 202 is connected to a programming device 206 and an output select device 208, while the electrical fuse 204 is connected to a programming device 210 and an output select device 212. While the devices 206, 208, 210 and 212 are shown to be thick-oxide NMOS transistors, it is nevertheless not limited to the designs shown, as it is understood that other known designs may be implemented without deviating from the spirit of this invention.

The electrical fuse 202 can be programmed and read in the same manner as any fuse cell with one electrical fuse. When the electrical fuse 202 is to be programmed, the programming device 206 is turned on with a high signal at a select line "WSel1" to allow high programming voltage from voltage source VDDQ to reach, and break, the electrical fuse 202. If the electrical fuse 202 is to be read, the programming device 206 is turned off with a low signal at the select line "WSel1" and the output select device 208 is turned on with a high signal at a select line "RSel1", thereby allowing information at a node 214 to output through a read bit line Rbl.

If the electrical fuse 202 is defective, the electrical fuse 204 can be selected for programming or reading. The electrical fuse 204 can be programmed by turning on the programming device 210 with a high signal at a select line "WSel2" to allow a high programming voltage from the voltage source VDDQ to break the electrical fuse 204. The electrical fuse 204 can also be read by turning off the programming device 210 with a low signal at the select line "WSel2" and turning on the output select device 212 with a high signal at a select line "RSel2" to allow signal at a node 216 to output through the read bit line Rbl.

There are several methods for selecting which set of programming signals (select line "WSel1" or "WSel2") and reading signals (select line "RSel1" or "RSel2") to be used to determine the selection of a specific electrical fuse. A separate tag bit is implemented to determine either set 1 which includes "WSel1" and "RSel1" or set 2 which includes "WSel2" and "RSel2" is to be used, depending on whether or not this bit has been programmed. If the tag bit has not been programmed, set 1 would be used to select the electrical fuse 202, which is the original electrical fuse. By contrast, if the tag bit has been programmed, set 2 would be used instead to select the electrical fuse 204, which is the redundant electrical fuse. It is noteworthy that the tag bit can be a stand alone bit outside of the fuse array as well as being a part of the fuse array.

This method allows other schemes of programming to be applied with this fuse cell configuration with 100 percent redundancy. For example, both the electrical fuses 202 and 204 can be used at the same time. If fuses are very easy to be programmed, both fuses can be programmed and only one specific combination such as (1,1) can indicate a true programmed state "1". Any other combinations such as (0,0), (0,1), or (1,0) will represent a true unprogrammed state "0". Such a combination can be determined by logic operations. For the immediate example, the logic operation may be an "AND" between the two fuses. Other single or combinational logic operations can also be provided. For fuse cells where fuses are very hard to be programmed, both fuses can be programmed as well, and if any one fuse out of the two fuses is programmed and read as "1", the output will be "1". For fuse cells with redundancy features, it can be programmed so that fuses from the first set of fuses and the second set of fuses can be used in combination.

Figure 3:
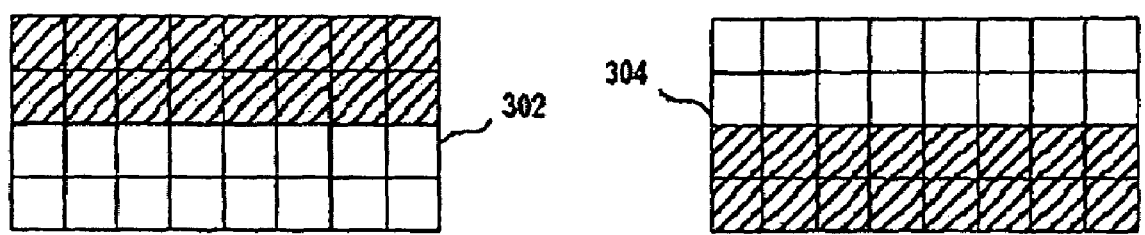
FIG. 3 presents two fuse arrays with full redundancy in accordance with another embodiment of the present invention.

FIG. 3 presents two sample ways 302 and 304 for using a fuse array with full redundancy in accordance with another embodiment of the present invention. It is assumed that the fuse array contains 32 bits (as represented by a square in either 302 or 304) whether the upper 16 bits are used as in 302, or the lower 16 bits are used as in 304. However, only the first set or the upper 16 bits will be used in the fuse array if a tag bit, which can be a digital parameter of any sort, is unprogrammed. However, if any of the upper 16 bits have defects, a second set or the lower 16 bits will be used instead by programming the tag bit. It is noteworthy that the tag bit can be a designated bit selected from the fuse array itself or a separate bit outside of the immediate fuse array as long as the fuse array is associated with at least one tag bit. In this sense, the upper 16 bits will be seen as bits made possible by original electrical fuses, while the lower 16 bits will be seen as bits made possible by redundant electrical fuses. The first set and the second set can be implemented in one physical fuse array as one embodiment of this invention. In another embodiment, the last bit of a fuse array is used as tag bit. The last bit is read out first to determine whether the upper 16 bits or the lower 16 bits will be used.

Figure 4:
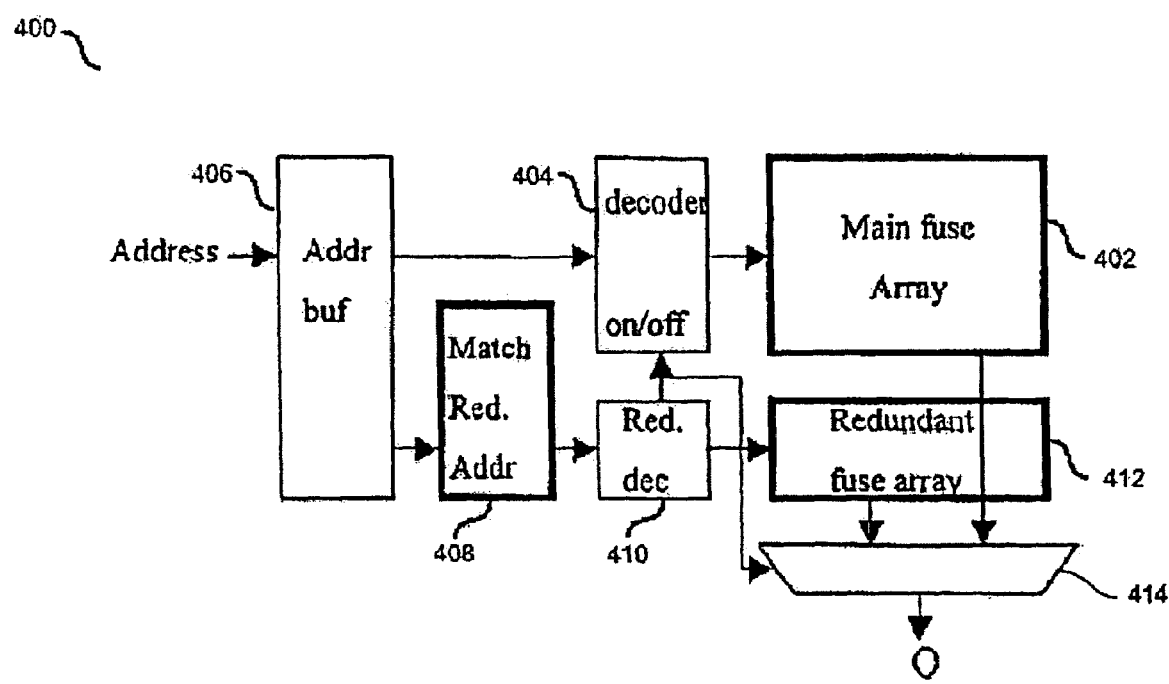
FIG. 4 presents a circuit that can replace defective fuses in an original fuse array with electrical fuses from a redundant fuse array in accordance with another embodiment of the present invention.

FIG. 4 presents a circuit 400 that can replace defective fuses in an original fuse array with electrical fuses from a redundant fuse array in accordance with another embodiment of the present invention. The circuit 400 provides an ability to implement redundancy even as the number of redundant electrical fuses is smaller than the number of original electrical fuses. A main fuse array 402 is controlled by a decoder 404, which takes in fuse locations from an address buffer 406. A match redundant address module 408, a redundancy decoder 410, and a redundant fuse array 412 are implemented in the circuit 400 to provide partial or full redundancy for the main fuse array 402. As such, a portion or an entirety of the defective fuse array can be replaced.

After an address buffer 406 provides the address of an electrical fuse to decoder 404, the decoder 404 locates the electrical fuse within the main fuse array 402 and provides the necessary signal for the device connected to the specific electrical fuse. However, when the address buffer 406 is accessing the fuse data, the buffered address signals are also fed into the match redundant address module 408 to check if the specific bit in that address is faulty or defective. The match redundant address module 408 is pre-programmed to contain addresses of faulty bits. If any faulty bits are found during testing, these addresses will be programmed permanently into the match redundant address module 408. If the input address from the address buffer 406 matches and the bit is shown faulty, a signal will be generated by the redundancy decoder 410 to disable the decoder 404. The redundancy decoder 410 will turn on and then fetch data from the redundant fuse array 412. An output selection module 414 will also be activated to select the fuse data read from the redundant fuse array instead of the main fuse array to generate a final output. It is noteworthy that the scheme used in this embodiment can also be applied to redundant addresses, redundant columns, or both redundant rows and columns.

This invention introduces a method to improve yield of electrical fuses by implementing redundancy for electrical fuses, thereby making high density array of electrical fuses possible. Redundant electrical fuses can be set up in parallel with the original electrical fuses to repair any defective electrical fuses that cause the faulty bits. This invention also introduces the methods for implementing different forms of redundancy for fuse arrays such as full redundancy, a method of implementing one extra fuse for each original fuse, and partial redundancy where only one extra fuse is added for several original fuses to save room.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrical fuse cell with redundancy features comprising:

a first set of electrical fuses having at least one electrical fuse contained therein; and a second set of electrical fuses having at least one electrical fuse for providing redundancy to at least one fuse of the first set, wherein if one of the first set of electrical fuses is defective, at least one of the second set of the electrical fuses can be programmed to provide a redundancy function of the defective fuse;

wherein each fuse in the first set is correlated with one in the second set for providing programmed data based on a combination of their individually programmed data.

2. The cell of claim 1 further comprising a first decoder for locating the fuse of the first set to be accessed based on an address provided by an address buffer and a second decoder for locating a redundant fuse from the second set for the fuse to be accessed in the first set.

3. An electrical fuse cell with redundancy features comprising:

a first set of electrical fuses having at least one electrical fuse contained therein, each fuse in the first set being coupled to an output select device and a programming device;

a second set of electrical fuses having at least one electrical fuse for providing redundancy to at least one fuse of the first set, each fuse in the second set being coupled to an output select device and a programming device, wherein if one of the first set of electrical fuses is defective, at least one of the second set of the electrical fuses can be programmed to provide a redundancy function of the defective fuse; and at least one programmable tag bit associated with the first set to indicate whether the at least one fuse of first set is defective;

wherein each fuse in the first set is correlated with one in the second set for providing programmed data based on a combination of their individually programmed data.

4. The cell of claim 3 further comprising a first decoder for locating the fuse of the first set to be accessed based on an address provided by an address buffer and a second decoder for locating a redundant fuse from the second set for the fuse to be accessed in the first set.

5. An electrical fuse cell with redundancy features comprising:

a first set of electrical fuses having at least one electrical fuse contained therein, each fuse in the first set being coupled to an output select device and a programming device;

a second set of electrical fuses having at least one electrical fuse for providing redundancy to at least one fuse of the first set, each fuse in the second set being coupled to an output select device and a programming device, wherein if one of the first set of electrical fuses is defective, at least one of the second set of the electrical fuses can be programmed to provide a redundancy function of the defective fuse;

a first decoder for locating the fuse of the first set to be accessed based on an address provided by an address buffer;

a second decoder for locating a redundant fuse from the second set for the fuse to be accessed in the first set; and at least one programmable tag bit associated with the first set to indicate whether the at least one fuse of first set is defective.

6. The cell of claim 5 further comprising a redundant match address module being pre-programmed to contain the addresses of faulty bits in the first set.

7. The cell of claim 6 wherein the redundant match address module receives a signal from the address buffer to determine if the at least one fuse from the first set is defective.

8. The cell of claim 5 wherein the second decoder generates a signal to disable the first decoder if the at least one fuse of the first set is defective.

9. The cell of claim 5 wherein each fuse in the first set is correlated with one in the second set for providing programmed data based on a combination of their individually programmed data.

10. The cell of claim 5 further comprising an output selection module operable to select fuse data from the second set instead of from the first set to generate a final output signal from the fuse cell.

* * * * *